United States Patent [19]
Gates

[11] Patent Number: 5,959,839
[45] Date of Patent: Sep. 28, 1999

[54] APPARATUS FOR HEAT REMOVAL USING A FLEXIBLE BACKPLANE

[75] Inventor: Frank Vernon Gates, Township of Roxbury, Morris County, N.J.

[73] Assignee: AT&T Corp, Middletown, N.J.

[21] Appl. No.: 08/775,919

[22] Filed: Jan. 2, 1997

[51] Int. Cl.[6] ..................................................... H05K 7/20
[52] U.S. Cl. .......................... 361/704; 257/719; 257/726; 361/715
[58] Field of Search ................................... 174/16.3, 252, 174/254; 257/718–719, 726–727; 361/704, 707, 709–711, 715–716, 720, 749

[56] References Cited

U.S. PATENT DOCUMENTS

| | | | |
|---|---|---|---|
| 3,766,439 | 10/1973 | Isaacson | 174/254 |
| 4,402,185 | 9/1983 | Perchak . | |
| 4,629,114 | 12/1986 | Baker . | |
| 4,748,495 | 5/1988 | Kucharek . | |
| 4,792,878 | 12/1988 | Buselmeier et al. . | |
| 4,792,879 | 12/1988 | Bayknecht et al. | 361/749 |
| 5,451,747 | 9/1995 | Sullivan et al. . | |
| 5,463,874 | 11/1995 | Farr . | |
| 5,537,834 | 7/1996 | Farr . | |

FOREIGN PATENT DOCUMENTS 000065425  11/1982  European Pat. Off. ................ 361/749

OTHER PUBLICATIONS

Kerjilian et al. "IBM Tech. Disl.Bulletin, High Density Memory Package", vol. 27, No. 413, p. 2642, Sep. 1984.

*Primary Examiner*—Gregory Thompson

[57] ABSTRACT

An apparatus and method are provided for removing heat generated by the operation of electronic devices to allow for a more densely packed arrangement of the electronic devices on a parent board. The apparatus comprises a metallic housing that encloses a flexible backplane with a pair of rigid supports mounted on its bottom surface and at least one electrical device connected to the top surface of the backplane that is supported by the rigid supports. The flexible backplane is folded and positioned within the housing such that the rigid supports face inwardly with respect to the housing and the electronic devices face outwardly with respect to the housing. A biasing member is positioned between the rigid supports for biasing the electronic devices against the housing. The flexible backplane is a flexible circuit board that supports a PC card array and the loading device is a cylindrical elastomeric compressor. The metallic housing is an aluminum U-shaped structure, having a pair of parallel walls extending transversely from a shorter wall. An optional cover can be attached to the open end of the U-shaped housing to protect the inner structure. The outer surfaces of the parallel walls of a U-shaped housing are ribbed to provide a plurality of cooling fins for additional transfer of heat from the electronic devices to ambient air. The inner surfaces of the parallel walls comprise vertically extending grooves to guide the PC cards into position within the housing. Elastomeric conductive films are adhered to the inner surface of the housing within the grooves to better facilitate heat transfer to the cooling fins.

40 Claims, 5 Drawing Sheets

APPARATUS FOR HEAT REMOVAL USING A FLEXIBLE BACKPLANE

BACKGROUND OF THE INVENTION

1. Field of the Invention

The present invention relates in general to electronic devices and, more particularly, to the removal of heat dissipated by the operation of such electronic devices on printed circuit boards.

2. Description of the Related Art

The current trend in electronics manufacturing and assembly is to utilize more electronic devices with less or miniaturized hardware in order to provide more services to the user in more compact structures. However, miniaturization creates demanding thermal environments because the electronic devices, such as personal computer card ("PC card") assemblies, that are used in these host miniaturized hardware structures dissipate significant amounts of heat during operation. Conventional PC card assemblies are not designed for such demanding temperature environments and, as a result, their use and operation are adversely affected. If the temperature environment exceeds a threshold limit, the PC cards will "burn out" and become inoperable.

Presently, the adverse effects of the thermal environment caused by miniaturization are controlled by providing greater separation of the PC cards on a standard, less thermally dense parent board. As is well-known in the art, the standard parent board is a flat, rectangular structure. However, a shortcoming of using this structure is that greater separation of the PC cards results in a lower power density. In fact, large parent board structures do not employ more than 1 or 2 PC cards, in part because of this limitation. For example, the power density of a typical similar arrangement is only approximately 0.05 W/in$^3$, whereas a more densely packed arrangement could have a power density exceeding 0.2 W/in$^3$. In other words, maximum thermal dissipation cannot be obtained in the most compact structure.

SUMMARY OF THE INVENTION

The above-described problems and shortcomings of such prior art assemblies are solved and a technical advance is made over the prior art in accordance with the present invention by providing an apparatus more compact than the earlier designs and which allows for a greater number of electronic devices, thereby resulting in a significant increase in the power density within the structure.

In accordance with the present invention, an apparatus and method are provided for removing heat generated by the operation of electronic devices to allow for a more densely packed arrangement of the electronic devices on a parent board. The apparatus comprises a metallic housing that encloses a flexible backplane with a pair of rigid supports mounted on its bottom surface and at least one electronic device connected to the top surface of the backplane that is supported by the rigid supports. The flexible backplane is folded and positioned within the housing such that the rigid supports face inwardly with respect to the housing and the electronic device faces outwardly with respect to the housing. A biasing member is positioned between the rigid supports for pressing the electronic devices against the housing.

In one embodiment of the present invention, the flexible backplane is a flexible circuit board that supports a PC card array and the loading device is a cylindrical elastomeric compressor. The metallic housing is an aluminum U-shaped structure, having a pair of parallel walls extending transversely from a shorter wall. An optional cover can be attached to the open end of the U-shaped housing to protect the inner structure.

In another embodiment of the present invention, the loading device is a cantilever spring mounted midway between the rigid supports on the back surface of the flexible backplane.

In yet another embodiment of the present invention, the outer surfaces of the parallel walls of a U-shaped housing are ribbed to provide a plurality of cooling fins for additional transfer of heat from the electronic devices to ambient air. The inner surfaces of the parallel walls comprise vertically extending grooves to guide the PC cards into position within the housing. Elastomeric conductive films are bonded to the inner surface of the housing within the grooves to better facilitate heat transfer to the cooling fins.

BRIEF DESCRIPTION OF THE DRAWINGS

The foregoing features and other aspects of the invention are explained in the following description taken in connection with the accompanying drawings, wherein.

DETAILED DESCRIPTION

Figure 1:
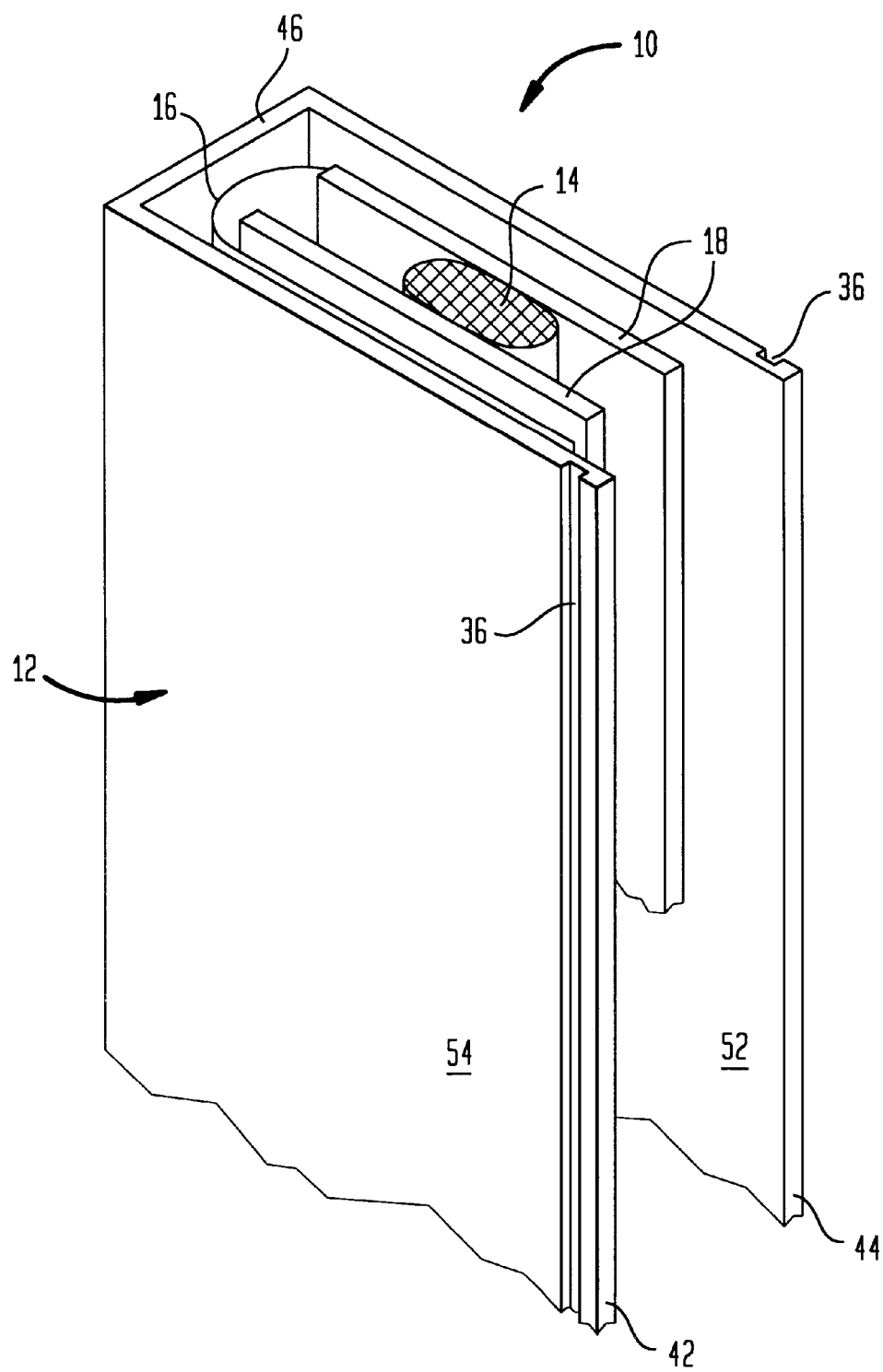
FIG. 1 is a perspective view of a first embodiment of the present invention.

While it is understood that the present invention is not necessarily limited to PC cards, FIG. 1 illustrates an apparatus 10 for removing heat from a PC card array. The apparatus 10 generally comprises a U-shaped housing 12 with an inner surface 52 and an outer surface 54, enclosing a folded flexible circuit board 16 supported by a pair of oppositely disposed rigid supports 18 on which the PC cards (not shown) are mounted. A biasing member or loading device 14, such as a cylindrical elastomeric compressor, positioned between the rigid supports 18 biases the PC cards against the inner surface 52 of the housing 12 and sustains the flexible circuit board 16 within the housing 12.

The U-shaped housing 12 is composed of a thermally conductive metal, such as aluminum, and comprises parallel walls 42 and 44 that extend transversely from a shorter wall 46. The housing 12 is open at the end opposite the shorter wall 46 to allow for PC card installation and ejection. However, the walls 42 and 44 have oppositely disposed vertical slots 36 positioned on the outer surface 54 to accommodate an aluminum end cover 34, as discussed below.

In an illustrative embodiment, the walls 42 and 44 of the housing 12 are four inches in width and have a length of 25 inches. The shorter wall 46 has a width of two inches and also has a length of 25 inches. Thus, the volume within the housing 12 is 200 in$^3$ (25 inches×4 inches×2 inches). If eight PC cards are installed with each generating approximately five watts of power, the power density within the housing 12 is 40 Watts (5 Watts/card×8 cards) per 200 in$^3$ or 0.2 W/in$^3$. As previously discussed, the power density of a typical prior art arrangement is 0.05 W/in$^3$. Therefore, in the illustrative embodiment, the power density is increased by a factor of 4 over the prior art.

Figure 2:
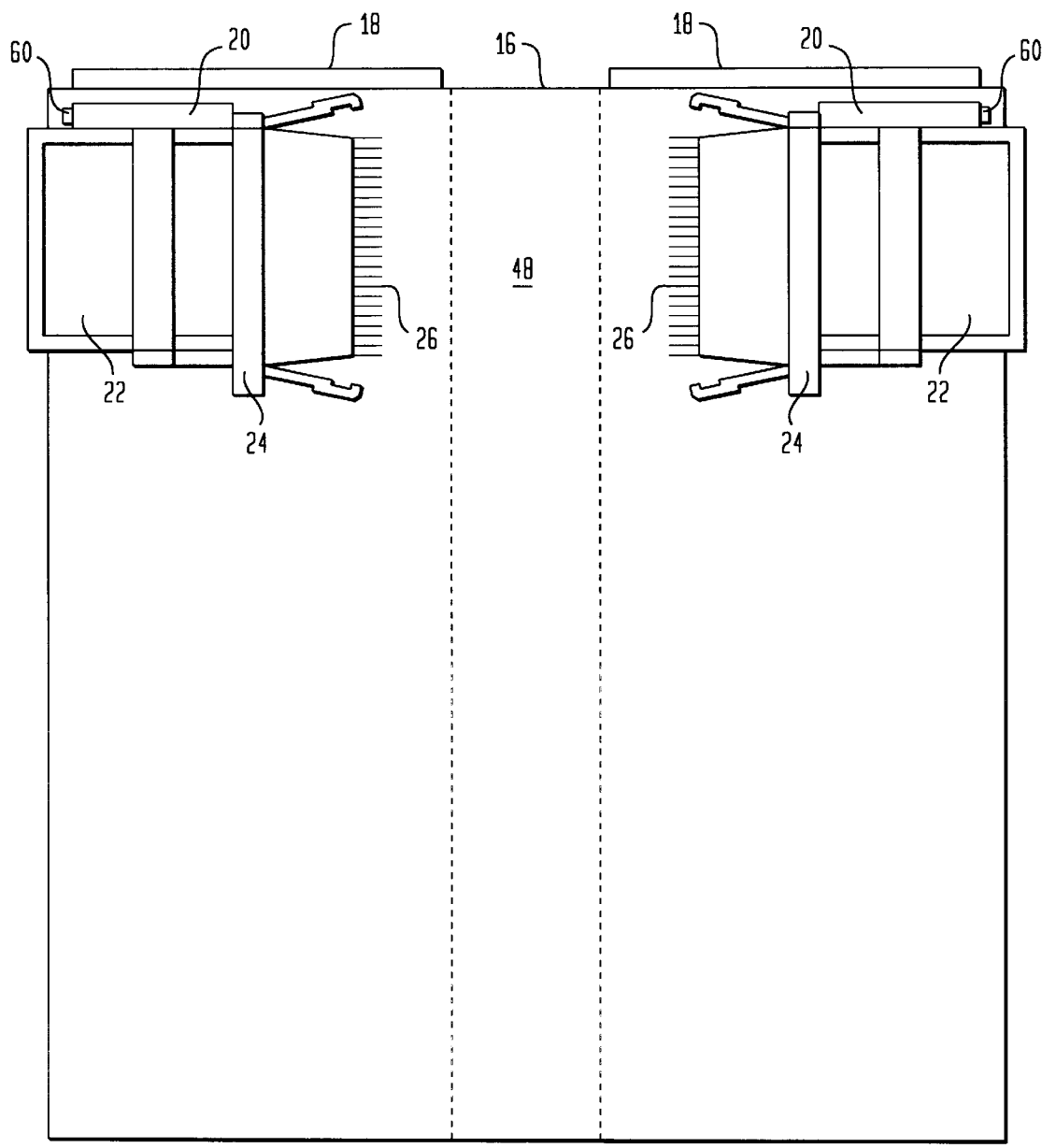
FIG. 2 is an unfolded view of the front surface of the flexible circuit board of FIG. 1.

Referring now to FIG. 2, an unfolded view of the front surface 48 of the flexible circuit board 16 is shown. The flexible circuit board 16 is composed of a "sandwich" of two flexible electrically nonconductive layers, such as polyimide, five to ten thousandths of an inch thick, with etched electrically conductive traces between the polyimide layers. The flexible circuit board 16 is preferably rectangular in shape (25 inches×11 inches) and is mounted on its back surface 50 to rigid supports 18. The rigid supports 18 are composed of a substance with the same thermal expansion characteristics as the flexible circuit board 16 such as a glass-epoxy composite. Preferably, each rigid support 18 is approximately the same length as the flexible circuit board 16, is four inches in width and 1/16-inch thick. The rigid supports 18 are mounted on the ends of the flexible circuit board 16 so that approximately three inches lies between them.

On the front surface 48 of the flexible circuit board 16 opposite the rigid supports 18, a plurality of PC card receptacles 24 can be mounted, although only two receptacles 24 are shown in FIG. 2 for illustrative purposes. The receptacles 24 have leads 26 attached to the flexible circuit board 16 to electrically connect the PC cards 22 that are inserted into the receptacles 24. Each receptacle 24 also comprises a connector/ejector assembly 20 that operates in a manner similar to a prior art assembly used to eject a 3½-inch disk from a disk drive on a personal computer. When a PC card 22 is inserted into the receptacle 24, a button 60 projects outwardly from the assembly 20. To eject the PC card 22, the button 60 is pushed inwardly and the PC card 22 pops out of the receptacle 24. This assembly 20 facilitates the removal of the PC cards 22, and is especially useful when the flexible circuit board 16 is sustained within the housing 12.

Figure 3:
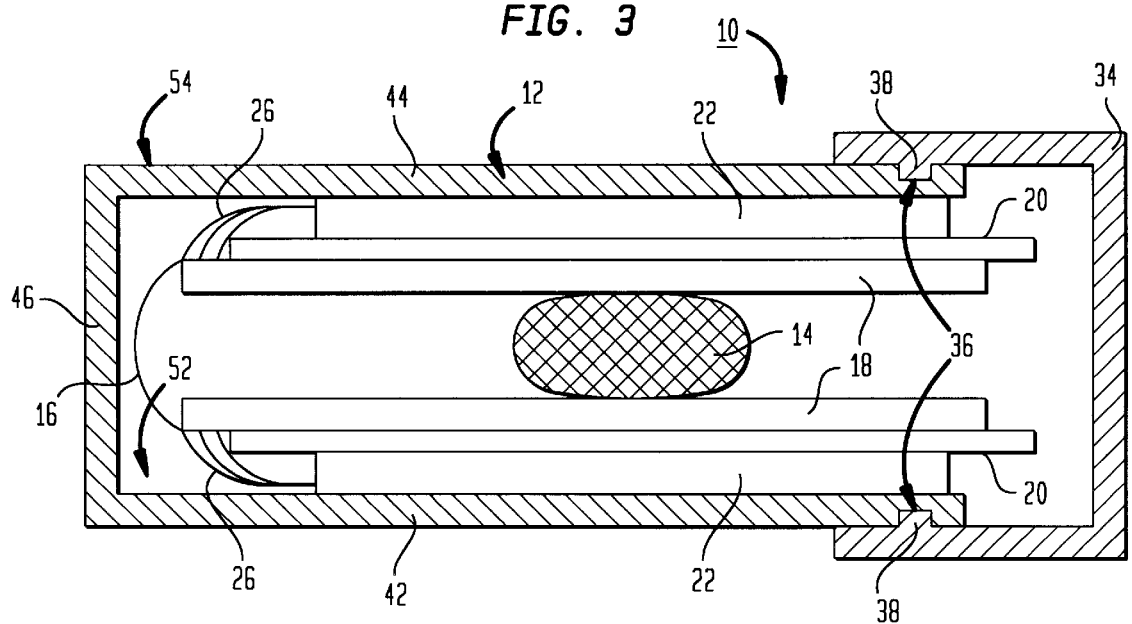
FIG. 3 is a top view of the first embodiment with an attached cover.

The positioning of the flexible circuit board 16 within the housing 12 is best understood by referring to FIG. 3, where a top view of the apparatus 10 is shown. As shown in FIG. 3, a generally U-shaped aluminum end cover 34 is attached to the housing 12. The U-shaped aluminum end cover 34 has projecting tab members 38 that correspond to the vertically extending slots 36 of the housing 12, so that when the projecting tab members 38 are inserted into the slots 36 in a vertically downward manner, the end cover 34 becomes connected to the aluminum housing 12. As is also illustrated by FIG. 3, the cylindrical elastomeric compressor 14 that presses the PC cards 22 against the housing 12 deforms against the rigid supports 18 while positioned between them.

Figure 4:
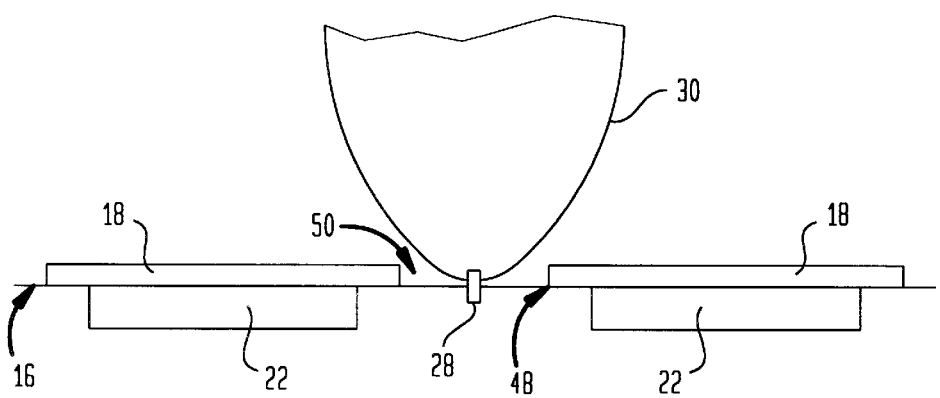
FIG. 4 is a top view of the flexible circuit board in accordance with a second embodiment of the present invention.

Referring now to FIG. 4, an alternative embodiment of the loading means for pressing the PC cards 22 against the housing 12 is shown. FIG. 4 illustrates a top view of the flexible circuit board 16, in which a cantilever spring 30 is mounted on the back surface 50 of the flexible circuit board 16 in a conventional manner, such as by means of a rivet 28 positioned midway between the rigid supports 18. A plurality of springs 30 may be used that are positioned in parallel relation to one another with one or two springs 30 utilized per pair of oppositely disposed PC cards 22. The operation of the springs 30 as a loading means is as follows. As the flexible circuit board 16 is folded for insertion within the housing 12, the rigid supports 18 compress the springs 30 inwardly. When the flexible circuit board 16 is positioned within the housing 12 and released, the springs 30 expand outwardly and bias the PC cards 22 against the housing 12, thereby securing the flexible circuit board 16 within the housing 12. The shape and cross-section of the springs 30 can be easily adjusted to provide the appropriate force to squeeze the PC cards 22 against the housing 12.

Figure 5:
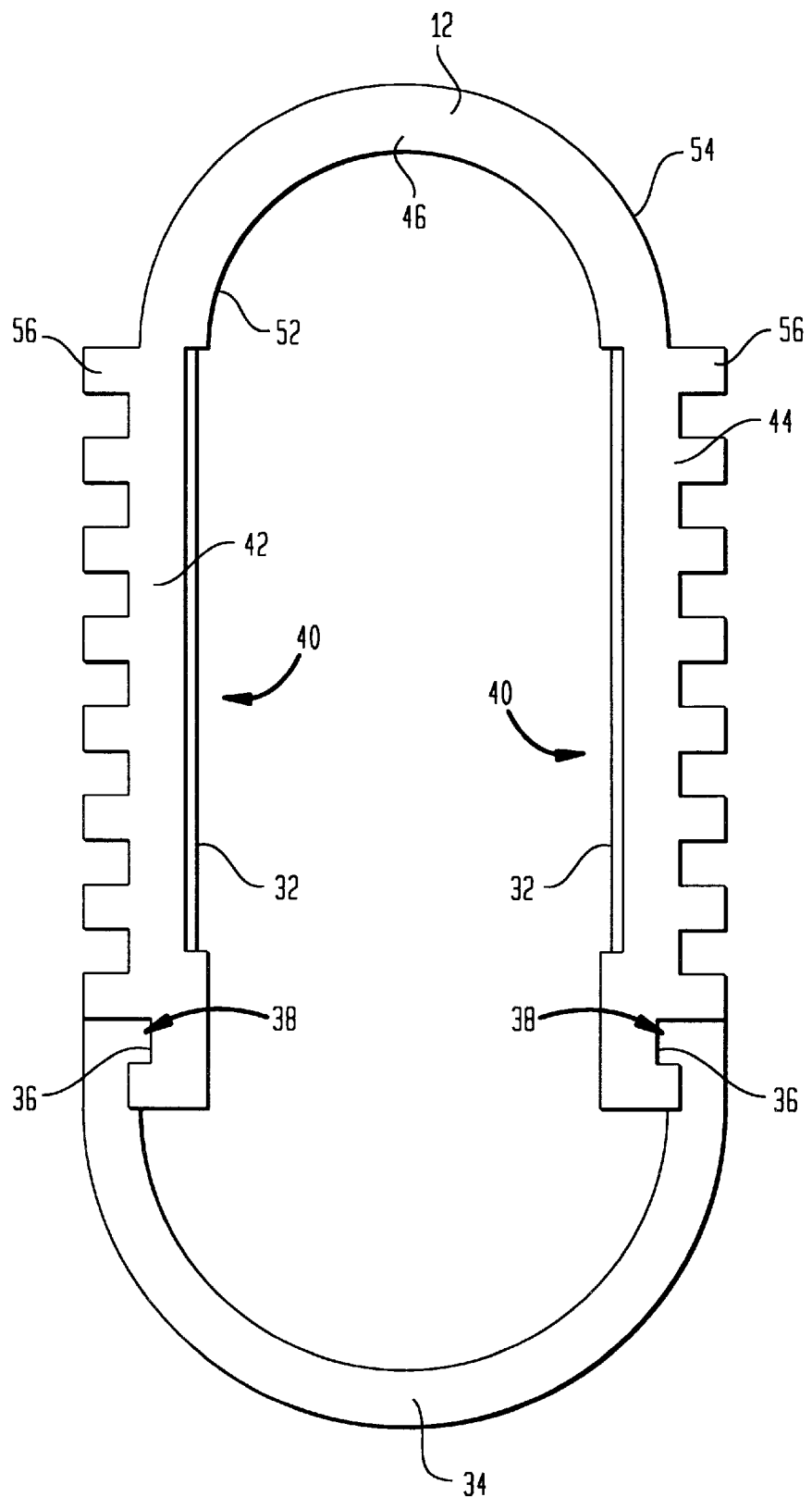
FIG. 5 is a top view of the housing of a third embodiment of the present invention.
Figure 6:
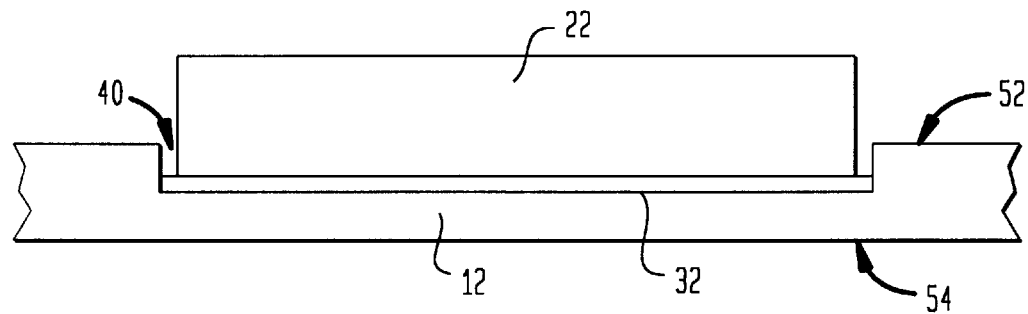
FIG. 6 is a partial view of the housing of FIG. 5 with an elastomeric conductive film in contact with a PC card.

Referring to FIG. 5, another alternative embodiment of the invention is shown. In this embodiment, the shorter wall 46 of the housing 12 is curved to accommodate the shape of the folded flexible circuit board 16 in order to reduce the volume within the housing 10 and thereby increase the power density. Each inner surface 52 of the walls 42 and 44 of the housing 12 contains a vertical groove 40 of approximately the same width as the PC cards 22 to guide and position the PC cards 22 and thus the flexible circuit board 16 vertically downward within the housing 12. It should be noted that the grooves 40 can also be positioned horizontally on the inner surfaces 52 of the walls 42 and 44 for insertion of the flexible circuit board 16 horizontally inward with respect to the housing 12. A conductive elastomeric film 32, such as silicon having a preferred thickness of approximately 0.04 inches, is bonded to the surfaces of the grooves 40 to better facilitate heat transfer to the housing 12. The interface between the PC card 22 and the conductive elastomeric material 32 is best illustrated by reference to FIG. 6.

The outer surfaces 54 of the walls 42 and 44 of the housing 12 have a plurality of vertically extending cooling fins 56 that provide for additional heat transfer to the ambient air. As is well-known in the art, the thickness and spacing of the cooling fins 56 can be optimized by the consideration of factors such as the amount and type of metal used for the housing 12, the amount of power generated by the PC cards, and the characteristics of the external air flow.

Figure 7:
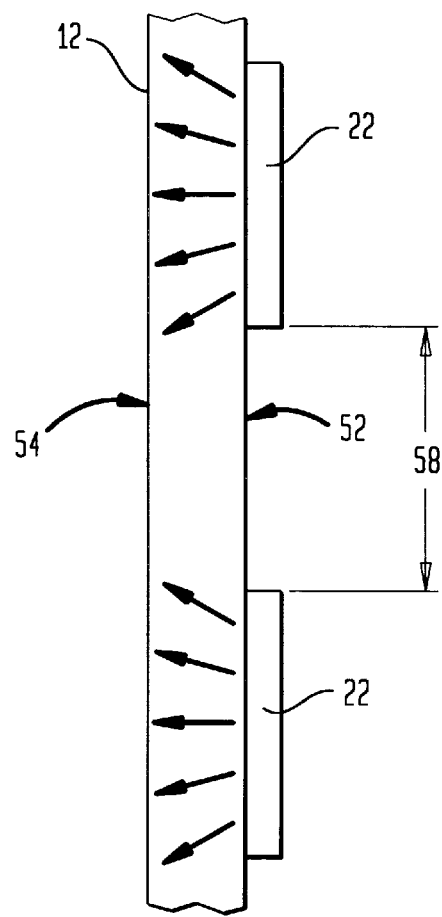
FIG. 7 is a partial top view of the housing of FIG. 1 in contact with PC cards to illustrate how spacing between the PC cards may be pre-determined to optimize heat transfer.

As illustrated by FIG. 7, a pre-determined distance 58 may be used for spacing the PC cards 22. The distance 58 is mathematically calculated to optimize heat transfer from the PC cards 22 to the housing 12. As is well-known in the art, the more closely spaced heat sources are positioned, the hotter the aluminum they are in contact with will become. Thus, there is a practical limit as to how closely the PC cards 22 may be positioned without exceeding the maximum limit of the silicon junctions within integrated circuits mounted on the PC cards 22 which results in "burn out" of the PC cards 22. Accordingly, the distance 58 is the minimum distance the PC cards 22 may be placed without "burning out." The distance 58 may be calculated by using any of a number of computer programs that are presently available to specifically perform this function.

Although illustrative preferred embodiments have been described herein in detail, it should be noted and will be appreciated by those skilled in the art that numerous variations may be made within the scope of this invention and without sacrificing its advantages. For instance, it is understood that the present invention is not limited to thermal management of PC card assemblies and is equally applicable to thermal management of other electronic heat generating devices. The terms and expressions have been used herein as terms of description and not terms of limitation. There is no intention to use the terms or expressions to exclude any equivalents of features shown and described or portions thereof and this invention should be defined in accordance with the claims which follow.

What is claimed is:

1. An apparatus for holding and dissipating heat generated by a PC card, comprising:
   a metallic housing having an open end and an interior and an exterior surface;
   a flexible circuit board positioned within said housing, said circuit board having first and second surfaces;
   a PC card receptacle connected to said circuit board and adapted to receive and operatively connect a PC card to said second surface;
   a pair of rigid supports mounted on said first surface of said circuit board, wherein said circuit board is positioned within said housing such that said rigid supports face inwardly with respect to said housing and said receptacle faces outwardly with respect to said housing; and
   a biasing member in contact with said rigid supports to bias said PC card against said metallic housing.

2. The apparatus of claim 1, wherein said biasing member is positioned between said rigid supports.

3. The apparatus of claim 2, wherein said biasing member is a cylindrical elastomeric compressor.

4. The apparatus of claim 2, wherein said biasing member is a cantilever spring mounted midway between said rigid supports on said first surface of said circuit board.

5. The apparatus of claim 1, further comprising an end cover releasably connected to said housing and enclosing said open end of said housing.

6. The apparatus of claim 1, further comprising a plurality of cooling fins formed on said exterior surface of said housing.

7. An apparatus for removing heat generated by the operation of electronic devices, comprising:
   a thermally conductive housing;
   a flexible backplane having a first surface and a second surface;
   a pair of rigid supports mounted on said first surface of said backplane, wherein said backplane is supported by said rigid supports;
   receptacle means for operatively connecting at least one electronic device to said second surface of said backplane;
   wherein said flexible backplane is positioned within said housing such that said rigid supports face inwardly with respect to said housing and said receptacle means faces outwardly with respect to said housing; and,
   a biasing member positioned between said rigid supports and adapted to bias said electronic device against said housing.

8. The apparatus of claim 7, wherein said flexible backplane is a flexible circuit board.

9. The apparatus of claim 7, wherein said housing is comprised of a thermally conductive metal.

10. The apparatus of claim 9, wherein said thermally conductive metal is aluminum.

11. The apparatus of claim 7, wherein said housing is generally U-shaped, comprising a pair of parallel walls extending transversely from an end wall.

12. The apparatus of claim 11, wherein said housing further comprises a pair of vertical slots adapted to lockingly receive a pair of corresponding tab members projecting from a thermally conductive end cover to releasably connect said end cover to said housing.

13. The apparatus of claim 7, further comprising at least one electronic device received within said receptacle means and operatively connected to said second surface of said backplane, wherein said biasing member causes at least a portion of said electronic device to contact said housing.

14. The apparatus of claim 13, wherein at least one electronic device is a PC card.

15. The apparatus of claim 14, wherein said receptacle means comprises an assembly for operatively connecting and ejecting said PC card into and out of said receptacle means.

16. The apparatus of claim 7, wherein said biasing member is a cylindrical elastomeric compressor.

17. The apparatus of claim 7, wherein said biasing member is a cantilever spring mounted midway between said rigid supports on said first surface of said backplane.

18. The apparatus of claim 11, wherein said end wall has a curved shape.

19. The apparatus of claim 11, further comprising a plurality of cooling fins formed on an outer surface of each of said parallel walls for additional transfer of heat from said electronic device to ambient air.

20. The apparatus of claim 14, wherein a predetermined spacing is provided between a plurality of electronic devices on said flexible backplane to provide a maximum heat transfer from said plurality of electronic devices to ambient air.

21. The apparatus of claim 7, wherein said rigid supports have the same thermal expansion characteristics as said flexible backplane.

22. The apparatus of claim 21, wherein said flexible backplane is comprised of polyimide.

23. The apparatus of claim 22, wherein said rigid supports are comprised of glass epoxy.

24. A method of removing heat generated by an electronic device, comprising the steps of:
   mounting said electronic device on a first surface of a flexible backplane and supporting said electronic device by a pair of rigid supports mounted on a second surface of said flexible backplane;
   folding said flexible backplane so that said rigid supports face inwardly toward one another and said electronic device faces outwardly;
   inserting said backplane into a thermally conductive housing; and
   biasing said electronic device against said housing.

25. The method of claim 24, wherein said flexible backplane is a flexible circuit board.

26. The method of claim 24, wherein said housing is comprised of a thermally conductive metal.

27. The method of claim 26, wherein said thermally conductive metal is aluminum.

28. The method of claim 24, wherein said housing is generally U-shaped, comprising a pair of parallel walls extending transversely from an end wall, and wherein said step of inserting said flexible backplane into said thermally conductive housing further comprises the step of aligning a folded portion of said backplane adjacent to said end wall.

29. The method of claim 28, further comprising the step of lockingly receiving a thermally conductive end cover within a pair of vertical slots formed in said housing to releasably connect said end cover to said housing.

30. The method of claim 23, wherein said electronic device is a PC card.

31. The method of claim 30, wherein said mounting step comprises the step of inserting said PC card into a receptacle means mounted on said first surface of said flexible backplane.

32. The method of claim 31, further comprising the steps of operatively connecting and ejecting said PC card into and out of said receptacle means.

33. The method of claim 24, wherein said biasing step comprises the step of inserting a cylindrical elastomeric compressor between said rigid supports.

34. The method of claim 24, wherein said biasing step comprises the steps of:

mounting a cantilever spring midway between said rigid supports; and pressing said electronic device against said housing.

35. The method of claim 28, wherein said end wall has a curved shape.

36. The method of claim 28, further comprising the step of forming a plurality of cooling fins on an outer surface of each of said parallel walls.

37. The method of claim 30, wherein said mounting step further comprises the steps of:

predetermining a spacing to be provided between said PC card and a second PC card to be mounted on said flexible backplane wherein maximum heat transfer from said PC cards to air is provided; and mounting said second PC card to said first surface of said flexible backplane at said spacing.

38. The method of claim 24, wherein said rigid supports have the same thermal expansion characteristics as said flexible backplane.

39. The method of claim 38, wherein said flexible backplane is comprised of polyimide.

40. The method of claim 39, wherein said rigid supports are comprised of glass epoxy.

* * * * *